(12) United States Patent
Yada et al.

(10) Patent No.: US 9,140,984 B2
(45) Date of Patent: Sep. 22, 2015

(54) RADIATION-SENSITIVE COMPOSITION

(75) Inventors: Yuji Yada, Tokyo (JP); Tooru Kimura, Tokyo (JP); Tomohiro Utaka, Tokyo (JP)

(73) Assignee: JSR CORPORATION, Tokyo (JP)

( * ) Notice: Subject to any disclaimer, the term of this patent is extended or adjusted under 35 U.S.C. 154(b) by 14 days.

(21) Appl. No.: 13/527,731

(22) Filed: Jun. 20, 2012

(65) Prior Publication Data

US 2012/0282550 A1 Nov. 8, 2012

Related U.S. Application Data

(63) Continuation of application No. PCT/JP2010/072420, filed on Dec. 14, 2010.

(30) Foreign Application Priority Data

Dec. 22, 2009 (JP) .................................. 2009-291346

(51) Int. Cl.
*G03F 7/039* (2006.01)
*C08F 12/22* (2006.01)
*C08F 212/14* (2006.01)

(52) U.S. Cl.
CPC .............. *G03F 7/0392* (2013.01); *C08F 12/22* (2013.01); *C08F 212/14* (2013.01); *G03F 7/0397* (2013.01)

(58) Field of Classification Search
CPC ................................................... G03F 7/0045
See application file for complete search history.

(56) References Cited

U.S. PATENT DOCUMENTS

| 6,037,107 A | 3/2000 | Thackeray et al. |
| 6,645,698 B1 | 11/2003 | Thackeray et al. |

(Continued)

FOREIGN PATENT DOCUMENTS

| EP | 2112554 | 10/2009 |
| JP | 59-45439 | 3/1984 |

(Continued)

OTHER PUBLICATIONS

English Translation of JP2003005374.*

(Continued)

*Primary Examiner* — Cynthia H Kelly
*Assistant Examiner* — Anna Malloy
(74) *Attorney, Agent, or Firm* — Oblon, McClelland, Maier & Neustadt, L.L.P.

(57) ABSTRACT

A radiation-sensitive composition includes a polymer composition and a radiation-sensitive acid generator. The polymer composition includes a first polymer and a second polymer. The first polymer includes a repeating unit shown by a following formula (1). The second polymer includes a repeating unit shown by a following formula (2) and does not include a repeating unit shown by the formula (1).

11 Claims, 3 Drawing Sheets

(56) References Cited

U.S. PATENT DOCUMENTS

| | | | |
|---|---|---|---|
| RE38,980 E | 2/2006 | Thackeray et al. | |
| 2003/0013038 A1* | 1/2003 | Ichimura et al. | 430/270.1 |
| 2006/0141386 A1* | 6/2006 | Okui et al. | 430/270.1 |
| 2006/0292490 A1* | 12/2006 | Kodama et al. | 430/270.1 |
| 2008/0102407 A1* | 5/2008 | Ohsawa et al. | 430/286.1 |
| 2009/0186300 A1 | 7/2009 | Furuya et al. | |
| 2009/0269696 A1 | 10/2009 | Ohsawa et al. | |
| 2010/0136481 A1* | 6/2010 | Ando | 430/270.1 |

FOREIGN PATENT DOCUMENTS

| | | |
|---|---|---|
| JP | 60-52845 | 3/1985 |
| JP | 02-25850 | 1/1990 |
| JP | 11-167200 | 6/1999 |
| JP | 2003005374 A * | 1/2003 |
| JP | 2009-098687 | 5/2009 |
| JP | 2009098687 A * | 5/2009 |
| JP | 2009-175363 | 8/2009 |
| JP | 2009-263487 | 11/2009 |
| KR | 2009-0081321 | 7/2009 |
| TW | 2009-41130 | 10/2009 |

OTHER PUBLICATIONS

International Search Report for International Application No. PCT/JP2010/072420, Mar. 15, 2011.

* cited by examiner

RADIATION-SENSITIVE COMPOSITION

CROSS-REFERENCE TO RELATED APPLICATIONS

The present application is a continuation application of International Application No. PCT/JP2010/072420, filed Dec. 14, 2010, which claims priority to Japanese Patent Application No. 2009-291346, filed Dec. 22, 2009. The contents of these applications are incorporated herein by reference in their entirety.

BACKGROUND OF THE INVENTION

1. Field of the Invention

The invention relates to a radiation-sensitive composition.

2. Discussion of the Background

In the field of microfabrication represented by fabrication of integrated circuit elements, in order to obtain a higher degree of integration, the miniaturization of processing size in lithography is progressing. However, it is extremely difficult to form a fine pattern of no more than 0.3 μm with high accuracy by a conventional method using a visible light ray (wavelength: 800 to 400 nm) or a near ultraviolet ray (wavelength: 400 to 300 nm). Therefore, the use of deep ultraviolet rays represented by KrF excimer (wavelength: 248 nm) laser, ArF excimer laser (wavelength: 193 nm) and the like, X rays such as synchrotron radiation, charged particle rays such as electron beam has been studied intensively. Of these, especially, the lithography using an excimer laser has already been put into practical use and has been applied widely in manufacturing integrated circuit elements because of its high output, high efficiency and others.

And, as a resist suitable for deep ultraviolet rays such as an excimer laser, a "chemically amplified resist" has been used, in which, a radiation-sensitive acid generator which generates an acid by irradiation of radiation (hereinafter referred to also as "exposure") is used and the catalytic action of the acid improves the sensitivity of the resist.

As such a chemically amplified resist, for example, Japanese Patent Application Laid-open No. S59-45439 discloses the combination of a resin protected by a t-butyl group or a t-butoxycarbonyl group and a radiation-sensitive acid generator; Japanese Patent Application Laid-open No. S60-52845 discloses the combination of a resin protected by a silyl group and a radiation-sensitive acid generator. Further, as for chemically amplified resists, there are many other reports including Japanese Patent Application Laid-open No. H02-25850 disclosing a resist containing a resin having an acetal group and a radiation-sensitive acid generator.

However, due to the increasing complexity of integrated circuit element structure in recent years, in forming transistors having a three-dimensional structure represented by the Fin-FET or the like, lithography processes for patterning a resist pattern on a substrate having steps of polysilicon or the like have increased. In such a process, at the time of exposure, an insufficient amount of light which reaches the foot of the step causes a problem that the solubility of the resist at the exposed area is low and an undissolved residue of the resist (hereinafter referred to as scum) is left. Particularly, in the lithography process for forming a resist pattern for an ion implantation mask in which a lower-layer antireflection film cannot be used, as coupled with the effects of standing waves due to reflection from the substrate, applying conventional resist materials is becoming difficult, and a resist which better prevents a scum from being left has become demanded.

SUMMARY OF THE INVENTION

According to one aspect of the present invention, a radiation-sensitive composition includes a polymer composition and a radiation-sensitive acid generator. The polymer composition includes a first polymer and a second polymer. The first polymer includes a repeating unit shown by a following formula (1). The second polymer includes a repeating unit shown by a following formula (2) and does not include a repeating unit shown by the formula (1).

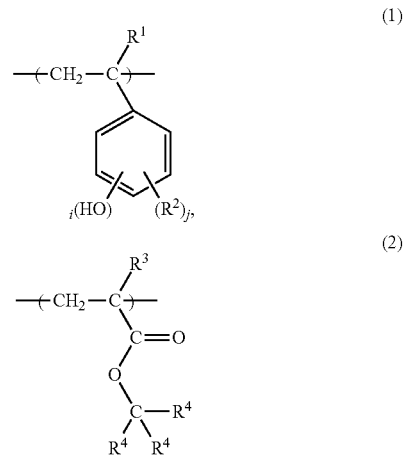

In the formula (1), $R^1$ represents a hydrogen atom, a methyl group, or a trifluoromethyl group. $R^2$ represents a hydrogen atom, a linear or branched alkyl group having 1 to 12 carbon atoms, a linear or branched alkoxyl group having 1 to 12 carbon atoms, or a group shown by the following formula (1-1). i and j each individually represent an integer from 0 to 3, satisfying $i+j \leq 5$.

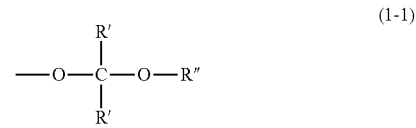

In the formula (1-1), each R' individually represents a hydrogen atom or a methyl group. R" represents a linear or branched alkyl group having 1 to 8 carbon atoms or a cycloalkyl group. In the formula (2), $R^3$ represents a hydrogen atom or a methyl group. Each $R^4$ individually represents a monovalent alicyclic hydrocarbon group having 4 to 20 carbon atoms, a derivative thereof, or a linear or branched alkyl group having 1 to 4 carbon atoms. Alternatively, two of $R^4$s bond to each other to form a divalent alicyclic hydrocarbon group having 4 to 20 carbon atoms or a derivative thereof in combination with the carbon atom to which the two of $R^4$s bond, and one of $R^4$s other than the two of $R^4$s is a linear or branched alkyl group having 1 to 4 carbon atoms, a monovalent alicyclic hydrocarbon group having 4 to 20 carbon atoms, or a derivative thereof.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DESCRIPTION OF THE EMBODIMENTS

Figure 1:
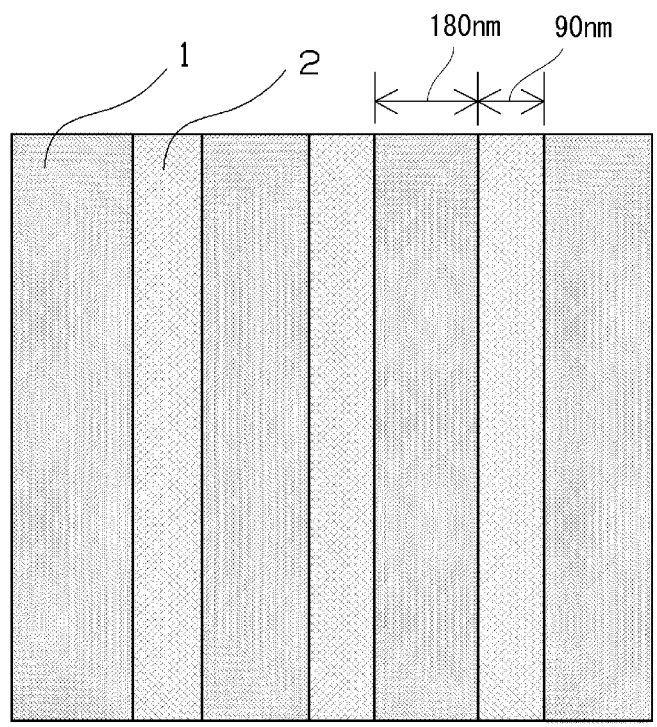
FIG. 1 is a schematic view from the above of a silicon wafer with polysilicon steps.

A radiation-sensitive composition of an embodiment of the present invention comprises a polymer (polymer composition) (A) comprising a polymer (A1) which comprises a repeating unit shown by the following formula (1) and a polymer (A2) which comprises a repeating unit shown by the following formula (2) and does not comprise a repeating unit shown by the formula (1), and a radiation-sensitive acid generator (B).

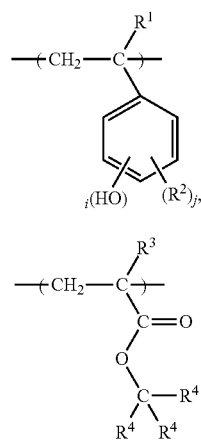

(1)

(2)

In the formula (1), $R^1$ represents a hydrogen atom, a methyl group, or a trifluoromethyl group, $R^2$ represents a hydrogen atom, a linear or branched alkyl group having 1 to 12 carbon atoms, a linear or branched alkoxyl group having 1 to 12 carbon atoms, or a group shown by the following formula (1-1), and i and j individually represent an integer from 0 to 3, satisfying i+j≤5;

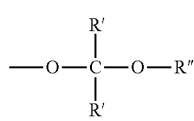

(1-1)

in the formula (1-1), R' individually represents a hydrogen atom or a methyl group and R" represents a linear or branched alkyl group having 1 to 8 carbon atoms or a cycloalkyl group.

In the formula (2), $R^3$ represents a hydrogen atom or a methyl group. As for $R^4$, (i) $R^4$ individually represents a monovalent alicyclic hydrocarbon group having 4 to 20 carbon atoms, a derivative thereof, or a linear or branched alkyl group having 1 to 4 carbon atoms or (ii) two of the $R^4$ groups bond to each other to form a divalent alicyclic hydrocarbon group having 4 to 20 carbon atoms or a derivative thereof in combination with the carbon atom to which the two $R^4$ groups bond and the remaining $R^4$ group is a linear or branched alkyl group having 1 to 4 carbon atoms, a monovalent alicyclic hydrocarbon group having 4 to 20 carbon atoms, or a derivative thereof.

In the radiation-sensitive composition of the embodiment of the present invention, the polymer (A2) comprises at least one repeating unit selected from the group consisting of a repeating unit shown by the following formula (3-1), a repeating unit shown by the following formula (3-2), and a repeating unit shown by the following formula (3-3).

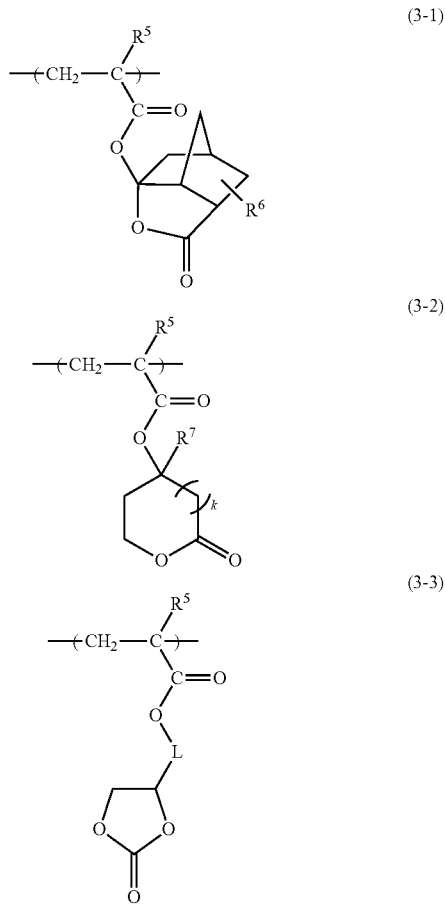

In the formulas (3-1) to (3-3), $R^5$ represents a hydrogen atom or a methyl group; in the formula (3-1), $R^6$ represents a hydrogen atom, a linear or branched alkyl group having 1 to 4 carbon atoms, a linear or branched alkoxyl group having 1 to 4 carbon atoms, or a linear or branched fluoroalkyl group having 1 to 4 carbon atoms; in the formula (3-2), $R^7$ represents a hydrogen atom or a linear or branched alkyl group having 1 to 4 carbon atoms and k represents an integer from 0 to 3; and in the formula (3-3), L represents a single bond or an alkylene group having 1 to 3 carbon atoms.

In the radiation-sensitive composition of the embodiment of the present invention, the polymer (A2) comprises a repeating unit shown by the following formula (4).

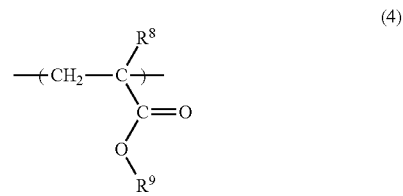

(4)

In the formula (4), $R^8$ represents a hydrogen atom or a methyl group and $R^9$ represents a polycyclic alicyclic hydrocarbon group having 7 to 20 carbon atoms.

In the radiation-sensitive composition of the embodiment of the present invention, the polymer (A2) is contained at 1 to 50 weight % for 100 weight % of the polymer (A) comprising the polymer (A1) and the polymer (A2).

The radiation-sensitive acid generator (B) in the radiation-sensitive composition of the embodiment of the present invention comprises a non-ionic radiation-sensitive acid generator.

In particular, the non-ionic radiation-sensitive acid generator is a sulfonyloxyimide compound. The non-ionic radiation-sensitive acid generator is a sulfonyldiazomethane compound. The radiation-sensitive acid generator (B) further comprises an onium salt compound that generates a benzenesulfonic acid that is substituted with a fluorine atom or unsubstituted.

Because the radiation-sensitive composition of the embodiment of the present invention comprises the polymer (A) comprising the polymer (A1) and the polymer (A2), particularly because the content of the polymer (A2) is set to be 1 to 50 weight %, in the lithography process with a substrate having steps, the development dissolution rate can be high even in areas where the amount of exposure is low, e.g. the foot of the step and the intersection portion of the resist pattern and the steps. Therefore, the radiation-sensitive composition of the embodiment of the present invention is excellent in scum margin and able to realize a resist pattern having a favorable shape.

It was found that a resin component for a radiation-sensitive composition that is excellent in scum margin even when it is used for forming a resist pattern for ion implantation mask on a substrate having steps can be obtained by mixing a partially protected polyhydroxystyrene based resin that is the base resin of a conventional KrF photoresist with a partially protected (meth)acrylic based resin that exhibits a higher rate of dissolution to a developer after a deprotection reaction. The present invention is based on this finding.

The embodiments will now be described with reference to the accompanying drawings, wherein like reference numerals designate corresponding or identical elements throughout the various drawings. In what follows, a polymer (A1) that is a partially protected polyhydroxystyrene based resin component and a polymer (A2) that is a partially protected (meth)acrylic based resin component, which are contained in a resin (A), and a radiation-sensitive acid generator (B) are explained.

Polymer (A1):

The polymer (A1) in the embodiment of the present invention is an alkali-insoluble or alkali-sparingly soluble polymer comprising the repeating unit shown by the above formula (1). The polymer (A1) is a polymer that becomes alkali-soluble due to the dissociation of the acid-labile group. And the polymer (A1) is contained in the resin component of the embodiment of the present invention. The polymer (A1) can comprise an acid-labile group-containing repeating unit in addition to the repeating unit shown by the above formula (1).

In the embodiment of the present invention, the term "alkali-insoluble or alkali-sparingly soluble" means a property such that in case where under the condition of alkali development that is adopted for forming a resist pattern from a resist film made by using a radiation-sensitive composition containing an acid-labile group-containing resin (polymer (A1) or polymer (A2)), the development of a film made by using only the acid-labile group-containing resin (polymer (A1) or polymer (A2)) instead of the resist film is conducted, 50% or more of the initial film thickness of the film remains after the development.

As examples of the linear or branched alkyl group having 1 to 12 carbon atoms which is $R^2$ in the above formula (1), methyl group, ethyl group, n-propyl group, i-propyl group, n-butyl group, 2-methylpropyl group, 1-methylpropyl group, t-butyl group and the like can be given.

As examples of the linear or branched alkoxyl group having 1 to 12 carbon atoms which is $R^2$ in the above formula (1), methoxyl group, ethoxyl group, n-propoxyl group, i-propoxyl group, n-butoxyl group, 2-methylpropoxyl group, 1-methylpropoxyl group, t-butoxyl group and the like can be given.

Of these, as the $R^2$, methyl group, ethyl group, n-butyl group and t-butyl group are preferable.

In case there are a plurality of $R^2$, they may be the same or different from each other.

The j is an integer from 0 to 3, preferably 0 or 1. The i is an integer from 1 to 3, preferably 1 or 2.

In the group shown by the above formula (1-1) which is $R^2$ in the above formula (1), $R''$ represents a linear or branched alkyl group having 1 to 8 carbon atoms or a cycloalkyl group.

As examples of the linear or branched alkyl group having 1 to 8 carbon atoms, methyl group, ethyl group, n-propyl group, i-propyl group, n-butyl group, 2-methylpropyl group, 1-methylpropyl group, t-butyl group, a group consisting of an alicyclic ring derived from norbornane, tricyclodecane, tetracyclododecane, adamantane, cyclopentane or cyclohexane, a group obtained by substituting this with an alkyl group and the like can be given.

As examples of the acid-labile group-containing repeating unit which the polymer (A1) can comprise, a repeating unit capable of forming a polymer which is alkali-insoluble or alkali-sparingly soluble in itself and is obtained by substituting hydrogen atoms of acidic functional groups in an alkali-soluble polymer having one or more types of acidic functional groups such as a phenolic hydroxyl group and a carboxyl group with one or more types of acid-labile groups capable of dissociating under the existence of an acid can be given.

As preferable examples of the acid-labile group-containing polymer (A1) in the embodiment of the present invention, a polymer (hereinafter referred to as "polymer (A1-a)") comprising a repeating unit shown by the following formula (5) (hereinafter referred to as "repeating unit (5)") and a repeating unit shown by the following formula (6) (hereinafter referred to as "repeating unit (6)") and/or a repeating unit shown by the following formula (7) (hereinafter referred to as "repeating unit (7)") can be given.

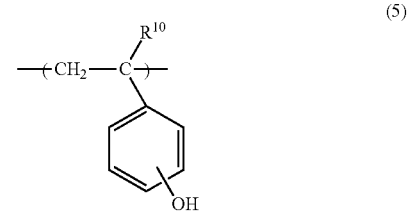

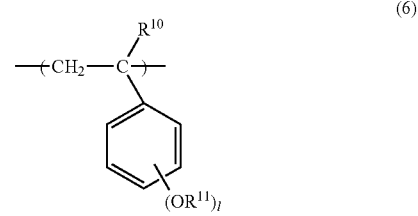

-continued

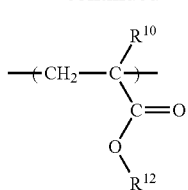

(7)

In the formulas (5), (6) and (7), $R^{10}$ represents a hydrogen atom or a methyl group; in the formula (6), $R^{11}$ represents a monovalent acid-labile group and l is an integer from 1 to 3; and in the formula (7), $R^{12}$ represents a monovalent acid-labile group.

As examples of the monovalent acid-labile group which is $R^{11}$ in the formula (6) and the monovalent acid-labile group which is $R^{12}$ in the formula (7), a substituted methyl group, a 1-substituted ethyl group, a 1-branched alkyl group, a triorganosilyl group, a triorganogermyl group, an alkoxycarbonyl group, an acyl group, a monovalent cyclic acid-labile group and the like can be given.

Of these monovalent acid-labile groups, t-butyl group, benzyl group, 1-methoxyethyl group, 1-ethoxyethyl group, trimethylsilyl group, t-butoxycarbonyl group, t-butoxycarbonylmethyl group, tetrahydrofuranyl group, tetrahydropyranyl group, tetrahydrothiofuranyl group, tetrahydrothiopyranyl group and the like are preferable.

As preferable examples of the repeating unit (5) in the embodiment of the present invention, repeating units obtained by a polymerizable unsaturated bond of 2-hydroxy styrene, 3-hydroxy styrene or 4-hydroxy styrene being cleaved can be given.

In polymer (A1-a), one type or two or more types of repeating unit (5) may exist.

In addition, as preferable examples of the repeating unit (6) in the embodiment of the present invention, repeating units obtained by a polymerizable unsaturated bond of 4-t-butoxy styrene, 4-(2-ethyl-2-propoxy)styrene, 4-(1-ethoxyethoxy) styrene, t-butoxycarbonyl styrene, t-butoxycarbonyl styrene methylene or the like being cleaved can be given.

In polymer (A1-a), one type or two or more types of repeating unit (6) may exist.

In addition, as the repeating unit (7) in the embodiment of the present invention, any of t-butyl(meth)acrylate, 1-methyl adamantyl(meth)acrylate, 1-ethyl adamantyl acrylate, 1-methylcyopentyl(meth)acrylate, 1-ethylcyclopentyl(meth) acrylate, 2,5-dimethylhexane-2,5-diacrylate is preferable.

In polymer (A1-a), one type or two or more types of repeating unit (7) may exist.

In the embodiment of the present invention, the polymer (A1) can further comprise a repeating unit other than the repeating units (5) to (7) (hereinafter referred to as "other repeating unit").

As examples of other repeating unit, repeating units obtained by a polymerizable unsaturated bond of vinyl aromatic compounds such as styrene, (meth)acrylic acid esters, carboxyalkyl esters of unsaturated carboxylic acid,
unsaturated amide compounds, unsaturated imide compounds, nitrogen-containing vinyl compounds or the like being cleaved can be given.

In polymer (A1), one type or two or more types of other repeating unit may exist.

As particularly preferable examples of polymer (A1) in the embodiment of the present invention, 4-hydroxy styrene/4-t-butoxy styrene copolymer, 4-hydroxy styrene/4-t-butoxy styrene/1-methylcyclopentyl acrylate copolymer, 4-hydroxy styrene/4-t-butoxy styrene/1-methylcyclopentyl acrylate copolymer, 4-hydroxy styrene/4-t-butoxy styrene/styrene copolymer, 4-hydroxy styrene/t-butyl acrylate/styrene copolymer, 4-hydroxy stylene/1-methylcyclopentyl acrylate/ styrene copolymer and 4-hydroxy styrene/4-t-butoxy styrene/2,5-dimethylhexane-2,5-diacrylate copolymer and the like can be given.

For the acid-labile group-containing polymer (A1), the introduction rate of the acid-labile groups (the ratio of the number of the acid-labile groups to the total number of the unprotected acidic functional groups and the acid-labile groups in the acid-labile group-containing polymer (A1)) is difficult to be flatly specified, depending on the type of the acid-labile groups and the type of the alkali-soluble resin into which the groups are introduced. However, it is preferably 10 to 100%, more preferably 15 to 100%.

In the polymer (A1), the content of the repeating units (5) is preferably 50 to 80 mol %, more preferably 65 to 75 mol %, the content of the repeating units (6) is preferably 10 to 40 mol %, more preferably 20 to 35 mol %, the content of the repeating units (7) is preferably 2 to 40 mol %, more preferably 10 to 30 mol % and the content of other repeating units is normally no more than 25 mol %, preferably no more than 10 mol %. If the content of the repeating units (5) is less than 50 mol %, there is a tendency for the adhesion of the resist pattern to the substrate to lower; if it is more than 80 mol %, there is a tendency for the contrast after development to lower. In addition, if the content of the repeating units (6) is less than 10 mol %, there is a tendency for the resolution to lower; if it is more than 40 mol %, there is a tendency for the adhesion of the resist pattern to the substrate to lower. In addition, if the content of the repeating units (7) is less than 2 mol %, there is a tendency for the resolution to lower; if it is more than 40 mol %, there is a risk of the dry etching resistance being insufficient. In addition, if the content of other repeating units is more than 25 mol %, there is a tendency for the resolution to lower.

The polystyrene-reduced weight average molecular weight measured by Gel Permeation Chromatography (GPC) (hereinafter referred to as "Mw") of the acid-labile group containing-polymer (A1) is preferably 1,000 to 150,000, more preferably 3,000 to 100,000. And, the ratio of Mw to the polystyrene-reduced number average molecular weight measured by Gel Permeation Chromatography (GPC) (hereinafter referred to as "Mn") of the acid-labile group-containing polymer (A1), Mw/Mn, is normally 1 to 10, preferably 1 to 5.

The acid-labile group-containing polymer (A1) can be produced, for example, by polymerizing polymerizable unsaturated monomers corresponding to the repeating unit (5), optionally together with polymerziable unsaturated monomers which give other repeating units, and then introducing one or more types of monovalent acid-labile groups $R^{11}$ to its phenolic hydroxyl groups; or by copolymerizing polymerizable unsaturated monomers corresponding to the repeating unit (5) and polymerizable unsaturated monomers corresponding to the repeating unit (6), optionally together with polymerziable unsaturated monomers which give other repeating units.

In the embodiment of the present invention, the acid-labile group-containing polymers (A1) may be used individually or in combination of two or more.

Polymer (A2):

The polymer (A2) in the embodiment of the present invention comprises the repeating unit shown by the above formula (2) and does not comprise the repeating unit shown by the above formula (1). The polymer (A2) is an alkali-insoluble or alkali-sparingly soluble polymer. The polymer (A2) is a polymer that becomes alkali-soluble due to the dissociation of the acid-labile group. And the polymer (A2) is contained in the resin component of the embodiment of the present invention.

As preferable examples of the monovalent alicyclic hydrocarbon group having 4 to 20 carbon atoms shown as $R^4$ in the formula (2) and the group formed by two of the $R^4$ groups bonding to each other, a group consisting of a alicyclic ring derived from norbornane, tricyclodecane, tetra cyclododecane, adamantane, cyclopentane or cyclohexane and a group obtained by substituting this with alkyl groups can be given.

And as concrete examples of the derivative of the monovalent alicyclic hydrocarbon group having 4 to 20 carbon atoms, a group obtained by substituting the above-mentioned group consisting of the alicyclic ring or the alkyl-substituted group thereof with one or more types of substitution groups such as a hydroxyl group, a hydroxyalkyl group having 1 to 4 carbon atoms, an alkoxyl group having 1 to 4 carbon atoms, an cyano group and a cyanoalkyl group of 2 to 5 carbon atoms can be given. Of the above, the ones substituted with a hydroxyl group, a carboxyl group, hydroxymethyl group, a cyano group, a cyanomethyl group are preferable.

And as concrete examples of the linear or branched alkyl group having 1 to 4 carbon atoms, methyl group, ethyl group, n-propyl group, i-propyl group, n-butyl group, 2-methyl propyl group, 1-methyl propyl group, t-butyl group and the like can be given. Of these, methyl group and ethyl group are preferable.

As concrete examples of the group shown by "—C(R$^4$)$_3$" in the formula (2), the groups shown by the following formulas (2-1) to (2-6) can be given.

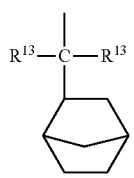

(2-1)

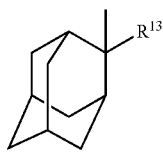

(2-2)

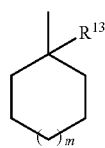

(2-3)

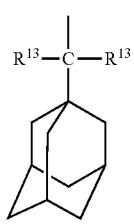

(2-4)

-continued

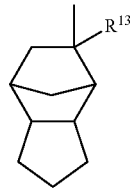

(2-5)

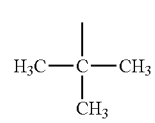

(2-6)

In the formulas (2-1) to (2-5), $R^{13}$ individually represents a linear or branched alkyl group having 1 to 4 carbon atoms. In the formula (2-3), m represents 0 or 1.

As concrete examples of the linear or branched alkyl group having 1 to 4 carbon atoms shown as $R^{13}$ in the formulas (2-1) to (2-5), methyl group, ethyl group, n-propyl group, i-propyl group, n-butyl group, 2-methylpropyl group, 1-methylpropyl group, t-buyl group and the like can be given. Of these, methyl group and ethyl group are preferable.

As other repeating units in polymer (A2), the above-mentioned (meth)acrylic acid esters and the repeating units of the above formulas (3-1) to (3-3) can be contained.

As concrete examples of the linear or branched alkyl group having 1 to 4 carbons shown as $R^6$ in the formula (3-1), methyl group, ethyl group, n-propyl group, i-propyl group, n-butyl group, 2-methylpropyl group, 1-methyl propyl group, t-butyl group and the like can be given. Of these, methyl group and ethyl group are preferable.

As concrete examples of the linear or branched alkoxyl group having 1 to 4 carbons shown as $R^6$ in the formula (3-1), methoxyl group, ethoxyl group, n-propoxyl group, i-propoxyl group, n-butoxyl group, 2-methyl propoxyl group, 1-methyl propoxyl group, t-butoxyl group and the like can be given.

As concrete examples of the linear or branched fluoroalkyl group having 1 to 4 carbon atoms shown as $R^6$ in the formula (3-1), a group obtained by replacing part or all of hydrogen atoms of the above-mentioned alkyl group with fluorine atoms can be given.

As concrete examples of the linear or branched alkyl group having 1 to 4 carbon atoms shown as $R^7$ in the formula (3-2), methyl group, ethyl group, n-propyl group, i-propyl group, n-butyl group, 2-methylpropyl group, 1-methylpropyl group, t-butyl group and the like can be given. Of these, methyl group and ethyl group are preferable.

As examples of the alkylene group having 1 to 3 carbon atoms shown as L in the formula (3-3), methylene group, ethylene group, n-propylene group and i-propylene group can be given.

Further, polymer (A2) can comprise a repeating unit shown by the above formula (4).

In the formula (4), it is preferable for $R^8$ to be a methyl group. As a polycyclic alicyclic hydrocarbon group having 7 to 20 carbon atoms shown as $R^9$, the ones shown by the following formulas (5-1) to (5-6) are preferable.

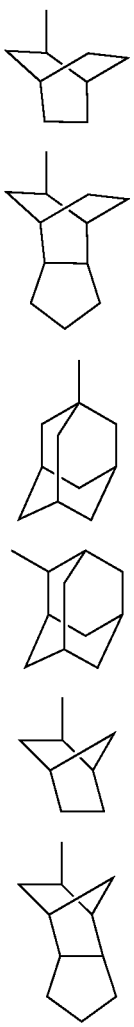

(5-1)

(5-2)

(5-3)

(5-4)

(5-5)

(5-6)

In the polymer (A2), the content of the repeating units (2) is preferably 20 to 80 mol %, more preferably 30 to 60 mol %, the content of the at least one repeating unit selected from the group consisting of the repeating units shown by the formula (3-1), the repeating units shown by the formula (3-2) and the repeating units shown by the formula (3-3) is preferably 20 to 70 mol %, more preferably 30 to 60 mol % and the content of the repeating units (4) is preferably 0 to 30 mol %, more preferably 0 to 20 mol %. If the content of the repeating units (2) is less than 20 mol %, there is a tendency for the resolution to lower; if it is more than 80 mol %, there is a tendency for the developability to lower. In addition, if the content of the repeating units (3-1) and the like is less than 20 mol %, there is a tendency for the developability to lower; if it is more than 70 mol %, there is a tendency for the effect of reducing scum to lower. In addition, if the content of the repeating units (4) is more than 30%, there is a risk of the resolution being insufficient.

The resin component of the embodiment of the present invention is the polymer (A) comprising the polymer (A1) and the polymer (A2). The mixing rate in the polymer (A) is as follows: The polymer (A2) is contained at 1 to 50 weight %, preferably 3 to 30 weight %, for 100 weight % of the polymer (A). If the content of the polymer (A2) is less than 1 weight %, there is a tendency for the effect of reducing scum to lower; if it is more than 50 weight %, there is a tendency that the compatibility with the polymer (A1) lowers and the roughness deteriorates.

Radiation-Sensitive Acid Generator (B):

A radiation-sensitive acid generator (B) (hereinafter referred to as acid generator (B)) is a component that generates an acid due to exposure. As the acid generator (B), a non-ionic radiation-sensitive acid generator is preferable. As examples of the non-ionic radiation-sensitive acid generator, a sulfonyloxyimide compound shown by the following formula (8) can be given.

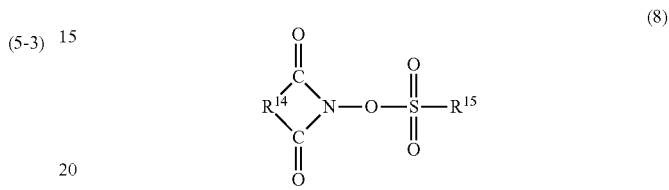

(8)

In the formula (8), $R^{14}$ represents an alkylene group, an arylene group, an alkoxylene group, a cycloalkylene group or a divalent group such as a cycloalkylene having a cyclic skeleton with an unsaturated bond and $R^{15}$ represents an alkyl group which may be substituted with a halogen atom, an alkyl group which may have a camphor skeleton, a cycloalkyl group which may have an ester bond or an aryl group which may be substituted with a halogen atom or an alkyl group. In the embodiment of the present invention, one type of sulfonyloxyimide compound or a mixture of two or more types of sulfonyloxyimide compound can be used.

As concrete examples of the sulfonyloxyimide compound, N-(trifluoromethanesulfonyloxy)bicyclo[2.2.1]hept-5-en-2,3-dicarboximide, N-(10-camphorsulfonyloxy)succinimide, N-(4-toluene sulfonyloxy)succinimide, N-(nonafluoro-n-butane sulfonyloxy)bicyclo[2.2.1]hept-5-en-2,3-dicarboximide, N-(benzene sulfonyloxy)bicyclo[2.2.1]hept-5-en-2,3-dicarboximide, N-{(5-methyl-5-carboxymethylbicyclo[2.2.1]heptane-2-yl)sulfonyloxy}succinimide and the like can be given.

As another non-ionic radiation-sensitive acid generator, a sulfonyldiazomethane compound is preferable. As examples of the sulfonyldiazomethane compound, a compound shown by the following formula (9) can be given.

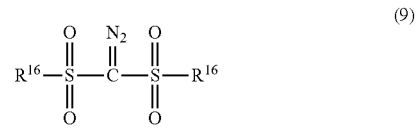

(9)

In the formula (9), each $R^{16}$ individually represents a monovalent group such as an alkyl group which may have a substitution group, a cycloalkyl group which may have a substitution group, an aryl group, a halogen-substituted alkyl group and a halogen-substituted aryl group.

As concrete examples of the sulfonyldiazomethane compound, bis(trifluoromethanesulfonyl)diazomethane, bis(cyclohexanesulfonyl)diazomethane, bis(phenylsulfonyl)diazomethane, bis(4-toluenesulfonyl)diazomethane, bis(2,4-dimethylbenzenesulfonyl)diazomethane, bis(4-t-butyl phenylsulfonyl)diazomethane, bis(4-chlorobenzenesulfonyl)diazomethane, methylsulfonyl.4-toluenesulfonyl diazomethane, cyclohexane sulfonyl.4-toluenesulfonyl diazomethane, cyclohexane sulfonyl.1,1-dimethylethane sulfonyl diazomethane, bis(1,1-dimethylethanesulfonyl)diazomethane, bis(1-methylethanesulfonyl)diazomethane, bis(3,3-dimethyl-1,5-dioxaspiro[5.5]dodecane-8-sulfonyl)diazomethane and bis(1,4-dioxaspiro[4.5]decane-7-sulfonyl) diazomethane are exemplified.

As the acid generator (B), an onium salt compound can be used.

As concrete examples of the onium salt compound, a compound shown by the following formula (10) or (11) can be given.

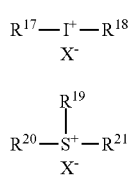

(10)

(11)

In the formula (10), $R^{17}$ and $R^{18}$ individually represent a substituted or unsubstituted linear or branched alkyl group having 1 to 10 carbon atoms or an substituted or unsubstituted aryl group having 6 to 18 carbon atoms; or $R^{17}$ and $R^{18}$ are combined with each other to form a cyclic structure together with the iodine atom in the formula.

In the formula (11), $R^{19}$, $R^{20}$ and $R^{21}$ individually represent a substituted or unsubstituted linear or branched alkyl group having 1 to 10 carbon atoms or an substituted or unsubstituted aryl group having 6 to 18 carbon atoms; or two of $R^{19}$, $R^{20}$ and $R^{21}$ are combined with each other to form a cyclic structure together with the sulfur atom in the formula and the remaining one is a substituted or unsubstituted linear or branched alkyl group having 1 to 10 carbon atoms or an substituted or unsubstituted aryl group having 6 to 18 carbon atoms.

In the formulas (10) and (11), $X^-$ represents $R-SO_3^-$ or $R-COOH^-$ where $R-$ represents an alkyl group which may be substituted with a fluorine atom, a hydroxyl group, an alkoxyl group, a carboxyl group or $R-$ represents an aromatic derivative which may be substituted with a fluorine atom, a hydroxyl group, an alkoxyl group, a carboxyl group.

As preferable examples of $R-SO_3^-$, trifluoromethanesulfonate, nonafluoro-n-butane sulfonate, benzene sulfonate, 10-camphor sulfonate, 2-trifluoromethyl benzene sulfonate, 4-trifluoromethyl benzene sulfonate, 2,4-difluoro benzene sulfonate, perfluoro benzene sulfonate, 2-(bicyclo[2.2.1]heptane-2-yl)-1,1-difluoroethanesulfonate, 2-(bicyclo[2.2.1]heptane-2-yl)ethane sulfonate can be given.

As preferable examples of $R-COOH^-$ among $X^-$ used in the formulas (10) and (11), groups shown by the following formulas (X-1) to (X-8) can be given.

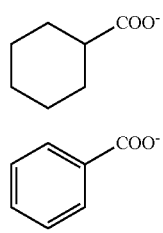

(X-1)

(X-2)

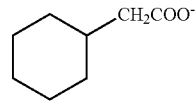

(X-3)

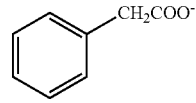

(X-4)

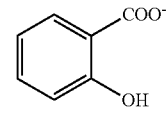

(X-5)

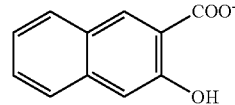

(X-6)

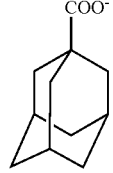

(X-7)

(X-8)

As examples of acid generators other than the above, disulfonylmethane compounds, oxime sulfonate compounds, hydrazine sulfonate compounds and the like can be given.

As examples of the disulfonylmethane compounds, a compound shown by the following formula (12) can be given.

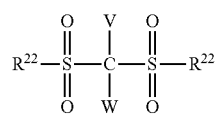

(12)

In the formula (12), each $R^{22}$ individually represent a linear or branched monovalent aliphatic hydrocarbon group, a cycloalkyl group, an aryl group, an aralkyl group, or another monovalent organic group having a hetero atom, and V and W individually represents an aryl group, a hydrogen atom, a linear or branched monovalent aliphatic hydrocarbon group, or another monovalent organic group having a hetero atom, wherein at least one of V and W is an aryl group, V and W bond to form a carbon monocyclic or carbon polycyclic structure having at least one unsaturated bond, or V and W bond to form a group shown by the following formula (13).

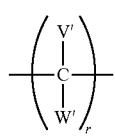

(13)

In the formula (13), V' and W' individually represent a hydrogen atom, a halogen atom, a linear or branched alkyl group, a cycloalkyl group, an aryl group, or an aralkyl group, or V' and W' bonding to the same carbon atom or different carbon atoms bond together to form a carbon monocyclic structure (in the case that there are two or more V's and W's, the V's and W's may be either the same or different), and r is an integer of 2 to 10.

As examples of the oxime sulfonate compounds, a compound shown by the following formula (13-1) or (13-2) can be given.

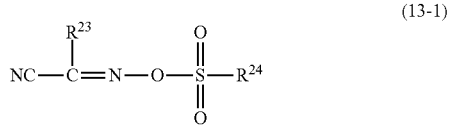

(13-1)

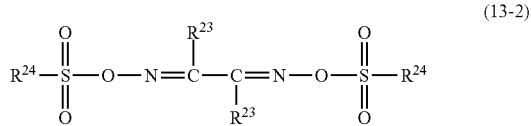

(13-2)

In the formulas (13-1) and (13-2), each $R^{23}$ and each $R^{24}$ individually represent a monovalent organic group.

These other acid generators may be used either individually or in combination of two or more.

In the embodiment of the present invention, the amount of the acid generator (B) is preferably 0.1 to 20 parts by weight, more preferably 0.5 to 15 parts by weight for 100 parts by weight of the acid-labile group-containing resin (A). If the amount of the acid generator (B) is less than 0.1 parts by weight, there is a tendency for the sensitivity and the developability to lower; if it is more than 20 parts by weight, there is a tendency for the radiation transparency, the pattern shape, the heat resistance and the like to deteriorate.

The amount of acid generators other than sulfonyloxyimide compounds, sulfonyldiazomethane compounds and onium salt compounds that generate a benzenesulfonic acid that is substituted with a fluorine atom or unsubstituted is normally no more than 30 weight %, preferably no more than 10 weight % for the total amount of acid generator (B). If the amount of the other acid generators is more than 30 weight %, there is a risk of the desired effects of the embodiment of the present invention being impaired.

The radiation-sensitive composition of the embodiment of the present invention can comprise an acid diffusion controller and a surfactant.

Acid Diffusion Controller:

The acid diffusion controller controls diffusion of an acid generated from the acid generator (B) upon exposure in the resist film to suppress undesired chemical reactions in the unexposed area. The addition of such an acid diffusion controller improves storage stability of the resulting radiation-sensitive resin composition and resolution as a resist. Moreover, the addition of the acid diffusion controller prevents the line width of the resist pattern from changing due to changes in the post-exposure delay (PED) between exposure and post exposure heat treatment, whereby a composition with remarkably superior process stability can be prepared.

As examples of the acid diffusion controller, nitrogen-containing organic compounds can be given.

As examples of the nitrogen-containing organic compounds, a compound shown by the following formula (14) (hereinafter referred to as "nitrogen-containing compound (i)"), a compound having two nitrogen atoms in a molecule shown by the following formula (15) (hereinafter referred to as "nitrogen-containing compound (ii)"), polyamino compounds or polymers having three or more nitrogen atoms (hereinafter collectively referred to as "nitrogen-containing compound (iii)"), an amide group-containing compound shown by the following formula (16), urea compounds, nitrogen-containing heterocyclic compounds and the like can be given.

(14)

In the formula (14), $R^{25}$ individually represents a hydrogen atom, a substituted or unsubstituted linear, branched or cyclic alkyl group, a substituted or unsubstituted aryl group or a substituted or unsubstituted aralkyl group.

As the nitrogen-containing compound (i), di(cyclo)alkylamines, tri(cyclo)alkylamines, substituted alkylamines such as trialcoholamines and aromatic amines such as aniline can be given.

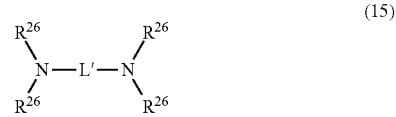

(15)

In the formula (15), $R^{26}$ individually represents a hydrogen atom, a substituted or unsubstituted linear, branched or cyclic alkyl group, a substituted or unsubstituted aryl group or a substituted or unsubstituted aralkyl group and L' represents a single bond, an alkylene group having 1 to 6 carbon atoms, an ether group, a carbonyl group or alkoxycarbonyl group.

As examples of the nitrogen-containing compound (iii), triazines, polyethyleneimine, polyallylamine, a polymer of 2-dimethyl amino ethyl acrylamide and the like can be given.

As examples of the amide group-containing compound, a compound shown by the following formula (16) can be given.

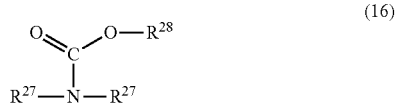

(16)

In the formula (16), $R^{27}$ individually represents a hydrogen atom, a substituted or unsubstituted linear, branched or cyclic alkyl group, a substituted or unsubstituted aryl group or a substituted or unsubstituted aralkyl group; or $R^{27}$ are combined with each other to form a heterocyclic structure. $R^{28}$ represents a linear, branched or cyclic alkyl group having 1 to 10 carbon atoms which may have a substitution group, a substituted or unsubstituted aryl group or a substituted or unsubstituted aralkyl group.

As examples of the urea compounds, urea, methyl urea, 1,1-dimethyl urea, 1,3-dimethyl urea, 1,1,3,3-tetramethyl urea, 1,3-diphenyl urea, tri-n-butylthiourea and the like can be given.

As preferable examples of the nitrogen-containing heterocyclic compounds, in addition to imidazoles, pyridines, piperazines, piperidines, triazines and morpholines, pyrazine, pyrazole, pyridazine, quinoxaline, purine, pyrrolidine, 1,4-diazabicyclo[2.2.2]octane and the like can be given.

The above acid diffusion controllers may be used individually or in combination of two or more.

The amount of the acid diffusion controllers is normally no more than 15 parts by weight, preferably 0.001 to 10 parts by weight, more preferably 0.005 to 5 parts by weight for 100 parts by weight of the acid-labile group-containing resin (A). If the amount of the acid diffusion controllers is more than 15 parts by weight, there is a tendency for the sensitivity as a resist and the developability of exposed areas to lower. In addition, if the amount of the acid diffusion controllers is less than 0.001 parts by weight, depending on process conditions, there is a risk of the pattern shape and the size fidelity of resist deteriorating.

The radiation-sensitive composition of the embodiment of the present invention can be blended with a surfactant that shows the effect to improve the coating properties and striation of the composition, development properties as a resist and the like.

As examples of such surfactants, polyoxyethylene lauryl ether, polyoxyethylene stearyl ether, polyoxyethylene oleyl ether, polyoxyethylene n-octylphenol ether, polyoxyethylene n-nonylphenol ether, polyethylene glycol dilaurate, polyethylene glycol distearate and the like can be given.

As examples of commercially available products, by its trade names, F-Top EF301, F-Top EF303, F-Top EF352 (manufactured by Tohkem Products Corporation), MEGAFAX F171, MEGAFAX F173 (manufactured by Dainippon Ink and Chemicals, Incorporated), Fluorad FC430, Fluorad FC431 (manufactured by Sumitomo 3M Limited), Asahi Guard AG710, Surflon S-382, Surflon SC101, Surflon SC102, Surflon SC103, Surflon SC104, Surflon SC105, Surflon SC106 (manufactured by Asahi Glass Co., Ltd.), KP341 (manufactured by Shin-Etsu Chemical Co., Ltd.), Polyflow No. 75, Polyflow No. 95 (manufactured by Kyoeisha Chemical Co., Ltd.) and the like can be listed.

The above surfactants may be used individually or in combination of two or more.

The amount of the surfactant is normally no more than 2 parts by weight for 100 parts by weight of the acid-labile group-containing resin (A).

Normally, in use, the positive radiation-sensitive composition of the embodiment of the present invention is prepared as a composition solution by dissolving uniformly in a solvent so that the concentration of total solids is normally 0.1 to 50 weight %, preferably 1 to 40 weight % and then filtering with a filter having a pore diameter, for example, of about 0.2 µm.

As examples of the solvent used in the preparation of the composition solution, ethylene glycol monoalkyl ether acetates such as ethylene glycol monomethyl ether acetate, ethylene glycol monoethyl ether acetate, ethylene glycol mono-n-propyl ether acetate and ethylene glycol mono-n-butyl ether acetate; propylene glycol mono alkyl ethers such as propylene glycol monomethyl ether, propylene glycol mono ethyl ether, propylene glycol mono-n-propyl ether and propylene glycol mono-n-butyl ether; propylene glycol dialkyl ethers such as propylene glycol dimethyl ether, propylene glycol diethyl ether, propylene glycol di-n-propyl ether and propylene glycol di-n-butyl ether; propylene glycol mono alkyl ether acetates such as propylene glycol monomethyl ether acetate, propylene glycol monoethyl ether acetate, propylene glycol mono-n-propyl ether acetate and propylene glycol mono-n-butyl ether acetate;

lactic acid esters such as methyl lactate, ethyl lactate, n-propyl lactate and i-propyl lactate; aliphatic carboxylic acid esters such as n-amyl formate, i-amyl formate, ethyl acetate, n-propyl acetate, i-propyl acetate, n-butyl acetate, i-butyl acetate, n-amyl acetate, i-amyl acetate, i-propyl propionate, n-butyl propionate and i-butyl propionate; other esters such as hydroxy acetic acid ethyl, 2-hydroxy-methylpropionic acid ethyl, 2-hydroxy-3-methylbutyric acid methyl, methoxy acetic acid ethyl, ethoxy acetic acid ethyl, 3-methoxy propionic acid methyl, 3-methoxypropionic acid ethyl, 3-ethoxypropionic acid methyl, 3-ethoxy propionic acid ethyl, 3-methoxy butyl acetate, 3-methyl-3-methoxy butyl acetate, 3-methyl-3-methoxy butyl propionate, 3-methyl-3-methoxy butyl butyrate, methyl acetoacetate, ethyl acetoacetate, methyl pyruvate and ethyl pyruvate; aromatic hydrocarbons such as toluene and xylene; ketones such as methyl ethyl ketone, 2-pentanone, 2-hexanone, 2-heptanone, 3-heptanone, 4-heptanone and cyclohexanone; amides such as N-methylformamide, N,N-dimethyl formamide, N-methylacetamide, N,N-dimethylacetamide and N-methylpyrrolidone; and lactones such as γ-butyrolactone can be given.

These solvents may be used individually or in combination of two or more.

EXAMPLES

In what follows, by way of examples, the present invention is further specifically described. However, the present invention is not limited to these examples.

Synthesis Example 1

103 g (70 mol %) of the compound shown by the following formula (L-1), 40 g (25 mol %) of the compound shown by the following formula (L-2), 5 g (5 mol %) of the compound shown by the following formula (L-3), 6 g of azobisisobutylonitrile (AIBN) and 1 g of t-dodecyl mercaptan were dissolved in 160 g of propylene glycol monomethyl ether and then were polymerized for 16 hours under a nitrogen atmosphere with the reaction temperature kept in 70° C. After the polymerization, the reaction solution was added dropwise to a large amount of n-hexane. The generated polymer was solidified and purified.

Then, after 150 g of propylene glycol monomethyl ether was added to this purified polymer again, 300 g of methanol, 80 g of triethylamine and 15 g of water were further added thereto. While refluxing at the boiling point, the hydrolysis reaction was carried out for 8 hours. After the reaction, the solvent and the triethylamine were distilled off under reduced pressure. The resulting polymer was dissolved in acetone. Then, it was added dropwise to a large amount of water to be solidified. The generated white powder was filtered and dried overnight at 50° C. under reduced pressure.

The resulting polymer had Mw=16,000 and Mw/Mn=1.7. And, as a result of $^{13}$C-NMR analysis, the polymer had the repeating units shown by the following formula (A1-1). The content of each repeating unit (molar ratio) was a/b/c=72.2/23.1/4.7. This polymer is referred to as resin (A1-1).

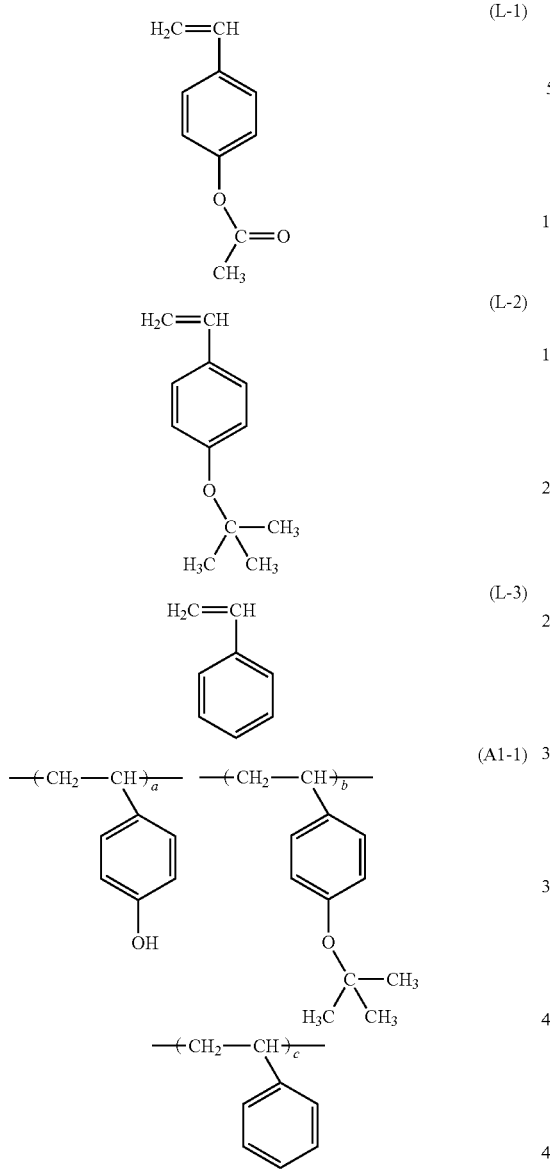

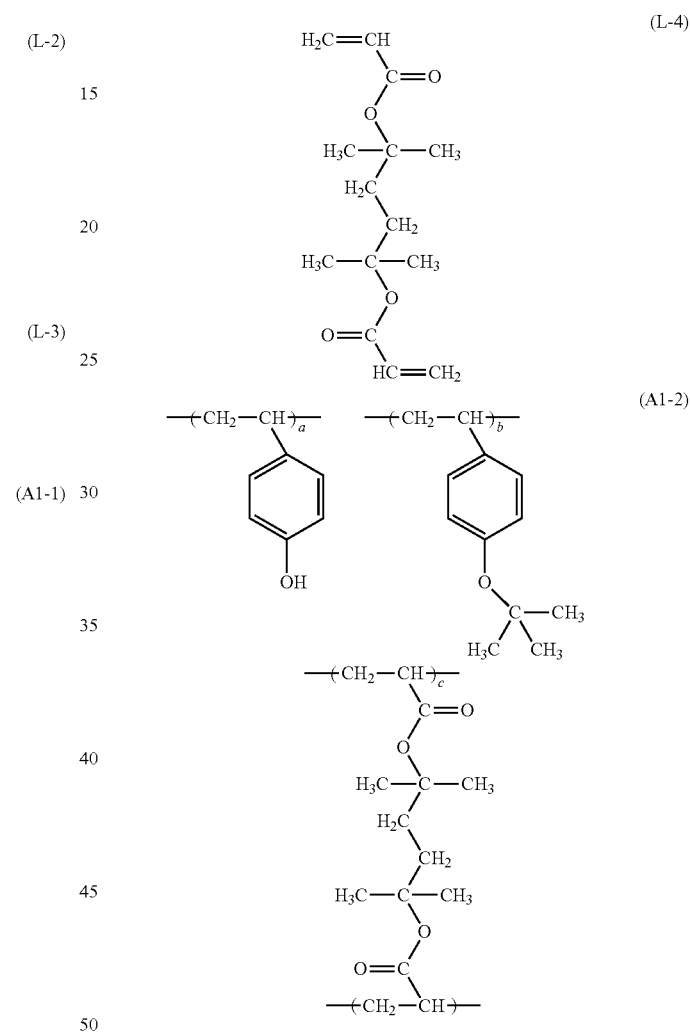

Synthesis Example 2

174 g (75 mol %) of the compound shown by the above formula (L-1), 55 g (22 mol %) of the compound shown by the above formula (L-2), 11 g (3 mol %) of the compound shown by the following formula (L-4), 14 g of AIBN and 11 g of t-dodecyl mercaptan were dissolved in 240 g of propylene glycol monomethyl ether and then were polymerized for 16 hours under a nitrogen atmosphere with the reaction temperature kept in 70° C. After the polymerization, the reaction solution was added dropwise to a large amount of n-hexane. The generated polymer was solidified, purified and then dried for 3 hours at 50° C. under reduced pressure.

Then, after 150 g of propylene glycol monomethyl ether was added to 190 g of this purified polymer again, 300 g of methanol, 100 g of triethylamine and 15 g of water were further added thereto. While refluxing at the boiling point, the hydrolysis reaction was carried out for 8 hours. After the reaction, the solvent and the triethylamine were distilled off under reduced pressure. The resulting polymer was dissolved in acetone. Then, it was added dropwise to a large amount of water to be solidified. The generated white powder was filtered and dried overnight at 50° C. under reduced pressure.

The resulting polymer had Mw=27,000 and Mw/Mn=2.6. And, as a result of $^{13}$C-NMR analysis, the polymer had the repeating units shown by the following formula (A1-2). The content of each repeating unit (molar ratio) was a/b/c=75.3/21.8/2.9. This polymer is referred to as resin (A1-2).

Synthesis Example 3

25 g of p-hydroxy styrene/p-t-butoxy styrene copolymer having a copolymerization molar ratio 90:10 was dissolved in 100 g of acetic acid n-butyl. After the bubbling of nitrogen gas was conducted for 30 minutes, 3.3 g of ethyl vinyl ether and 1 g of pyridinium p-toluenesulfonate as a catalyst were added thereto. The mixture was reacted at room temperature for 12 hours. Then, the reaction solution was added dropwise to 1 weight % aqueous ammonia solution. The generated polymer was solidified, filtered and then dried overnight at 50° C. under reduced pressure.

The resulting polymer had Mw=13,000 and Mw/Mn=1.01. And, as a result of $^{13}$C-NMR analysis, the polymer had the repeating units shown by the following formula (A1-3). The content of each repeating unit (molar ratio) was a/b/c=66.7/9.9/23.4. This polymer is referred to as resin (A1-3).

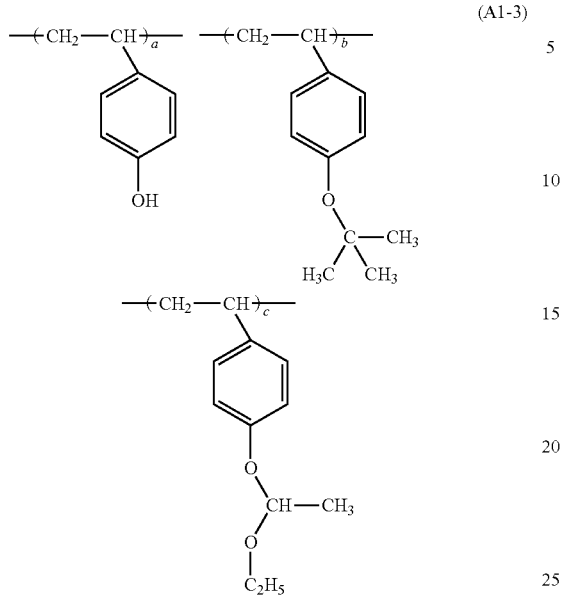

(A1-3)

Synthesis Example 4

150 g (65 mol %) of the compound shown by the above formula (L-1), 25 g (10 mol %) of the compound shown by the above formula (L-2), 65 g (25 mol %) of the compound shown by the following formula (L-5), 14 g of AIBN and 11 g of t-dodecyl mercaptan were dissolved in 240 g of propylene glycol monomethyl ether and then were polymerized for 16 hours under a nitrogen atmosphere with the reaction temperature kept in 70° C. After the polymerization, the reaction solution was added dropwise to a large amount of n-hexane. The generated polymer was solidified, purified and then dried for 3 hours at 50° C. under reduced pressure.

Then, after 150 g of propylene glycol monomethyl ether was added to 190 g of this purified polymer again, 300 g of methanol, 100 g of triethylamine and 15 g of water were further added thereto. While refluxing at the boiling point, the hydrolysis reaction was carried out for 8 hours. After the reaction, the solvent and the triethylamine were distilled off under reduced pressure. The resulting polymer was dissolved in acetone. Then, it was added dropwise to a large amount of water to be solidified. The generated white powder was filtered and dried overnight at 50° C. under reduced pressure.

The resulting polymer had Mw=16,000 and Mw/Mn=1.6. And, as a result of $^{13}$C-NMR analysis, the polymer had the repeating units shown by the following formula (A1-4). The content of each repeating unit (molar ratio) was a/b/c=66.7/8.9/24.4. This polymer is referred to as resin (A1-4).

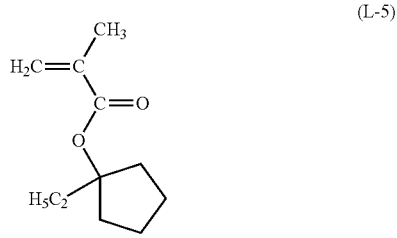

(L-5)

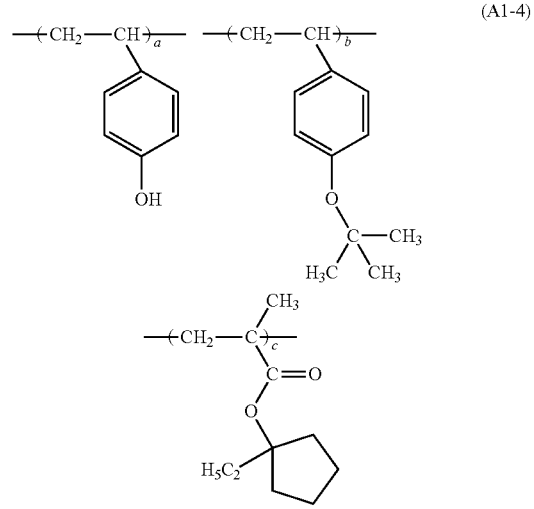

(A1-4)

Synthesis Example 5

54 g (50 mol %) of the compound shown by the following formula (L-6), 11 g (10 mol %) of the compound shown by the following formula (L-7) and 35 g (40 mol %) of the compound shown by the above formula (L-5) were dissolved in 200 g of 2-butanone. 5.58 g of AIBN was further added thereto to prepare a monomer solution. A 1000 ml three-necked flask into which 100 g of 2-butanone was put was purged with nitrogen for 30 minutes. Then, it was heated at 80° C. while being stirred and the prepared monomer solution was added dropwise thereto over 3 hours with a dropping funnel. The polymerization reaction was carried out for 6 hours, where the starting time of the dropping was regarded as the starting time of the polymerization. After the completion of the polymerization reaction, the polymerization solution was water-cooled so as to have a temperature of no more than 30° C. Then, it was put into 2000 g of methanol. The precipitated white powder was separated by filtration. The separated white powder was washed twice with 400 g of methanol in the form of slurry. Then, it was separated by filtration and dried at 50° C. for 17 hours. Thus, a polymer that is white powder was obtained (74 g, yield: 74%). The resulting polymer had Mw=6,900 and Mw/Mn=1.70. And, as a result of $^{13}$C-NMR analysis, the polymer had the repeating units shown by the following formula (A2-1). The content of each repeating unit (molar ratio) was a/b/c=53.0/9.8/37.2. This polymer is referred to as resin (A2-1).

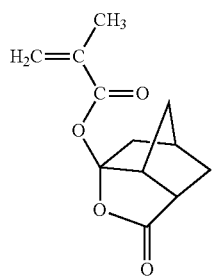

(L-6)

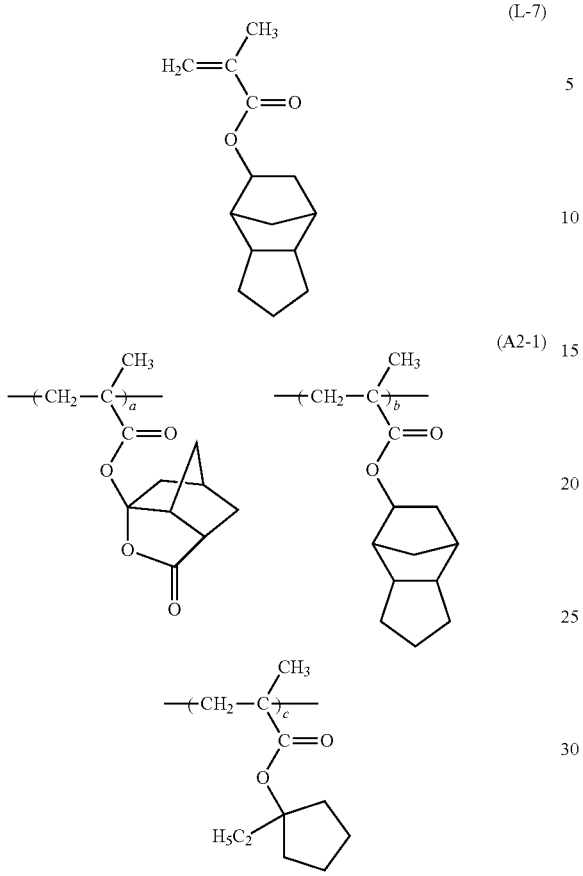

Synthesis Example 6

54 g (50 mol %) of the compound shown by the above formula (L-6), 11 g (10 mol %) of the compound shown by the above formula (L-7) and 35 g (40 mol %) of the compound shown by the following formula (L-8) were dissolved in 200 g of 2-butanone. 5.58 g of AIBN was further added thereto to prepare a monomer solution. A 1000 ml three-necked flask into which 100 g of 2-butanone was put was purged with nitrogen for 30 minutes. Then, it was heated at 80° C. while being stirred and the prepared monomer solution was added dropwise thereto over 3 hours with a dropping funnel. The polymerization reaction was carried out for 6 hours, where the starting time of the dropping was regarded as the starting time of the polymerization. After the completion of the polymerization reaction, the polymerization solution was water-cooled so as to have a temperature of no more than 30° C. Then, it was put into 2000 g of methanol. The precipitated white powder was separated by filtration. The separated white powder was washed twice with 400 g of methanol in the form of slurry. Then, it was separated by filtration and dried at 50° C. for 17 hours. Thus, a polymer that is white powder was obtained (74 g, yield: 74%). The resulting polymer had Mw=8,000 and Mw/Mn=1.70. And, as a result of $^{13}$C-NMR analysis, the polymer had the repeating units shown by the following formula (A2-2). The content of each repeating unit (molar ratio) was a/b/c=49.8/10.0/40.2. This polymer is referred to as resin (A2-2).

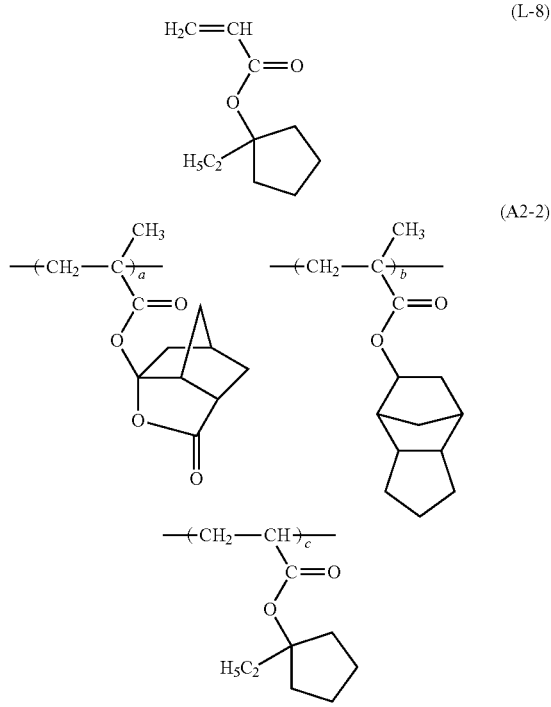

Synthesis Example 7

A polymer was obtained in the same way as in Synthesis Example 5 (78 g, yield: 78%) except that 39 g (37 mol %) of the compound shown by the following formula (L-9) was used instead of the compound shown by the above formula (L-7), 50 g (50 mol %) of the compound shown by the above formula (L-6) was used and 11 g (13 mol %) of the compound shown by the above formula (L-5) was used. The resulting polymer had Mw=5,200 and Mw/Mn=1.62. And, as a result of $^{13}$C-NMR analysis, the polymer had the repeating units shown by the formula (A2-3). The content of each repeating unit (molar ratio) was a/b/c=50.0/37.0/13.0. This polymer is referred to as resin (A2-3).

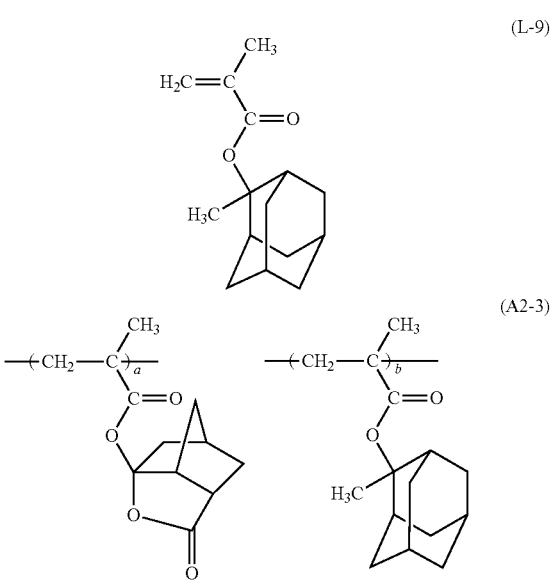

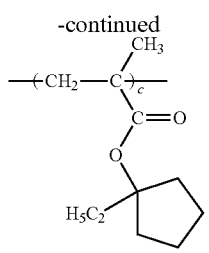

Synthesis Example 8

A polymer was obtained in the same way as in Synthesis Example 5 (71 g, yield: 71%) except that 10 g (10 mol %) of the compound shown by the following formula (L-10) was used instead of the compound shown by the above formula (L-7), 55 g (50 mol %) of the compound shown by the above formula (L-6) was used and 36 g (40 mol %) of the compound shown by the above formula (L-5) was used. The resulting polymer had Mw=8,100 and Mw/Mn=1.69. The remaining percentage of low-molecular-weight component was 0.04%. And, as a result of $^{13}$C-NMR analysis, the polymer had the repeating units shown by the formula (A2-4). The content of each repeating unit (molar ratio) was a/b/c=53.6/9.8/36.6. This polymer is referred to as resin (A2-4).

(L-10)

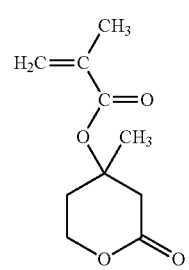

(A2-4)

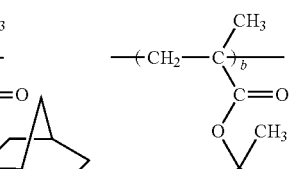

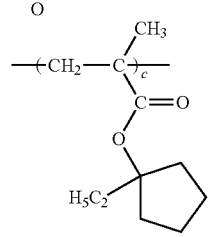

Synthesis Example 9

A polymer was obtained in the same way as in Synthesis Example 5 (71 g, yield: 71%) except that 55 g (50 mol %) of the compound shown by the above formula (L-6) was used and 45 g (50 mol %) of the compound shown by the above formula (L-5) was used. The resulting polymer had Mw=7,000 and Mw/Mn=1.65. And, as a result of $^{13}$C-NMR analysis, the polymer had the repeating units shown by the formula (A2-5). The content of each repeating unit (molar ratio) was a/b=50.9/49.1. This polymer is referred to as resin (A2-5).

(A2-5)

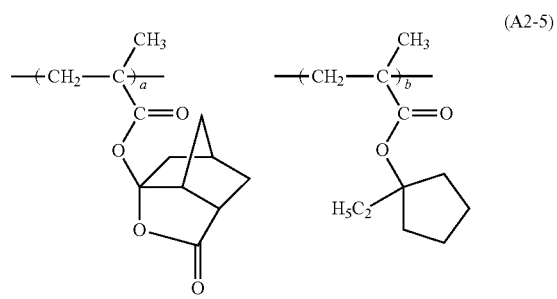

Synthesis Example 10

A polymer was obtained in the same way as in Synthesis Example 4 (79 g, yield: 79%) except that 49 g (50 mol %) of the compound shown by the above formula (L-6) was used, 36 g (35 mol %) of the compound shown by the above formula (L-9) was used and 16 g (15 mol %) of the compound shown by the following formula (L-11) was used. The resulting polymer had Mw=9,500 and Mw/Mn=1.55. And, as a result of $^{13}$C-NMR analysis, the polymer had the repeating units shown by the formula (A2-6). The content of each repeating unit (molar ratio) was a/b/c=49.0/37.0/14.0. This polymer is referred to as resin (A2-6).

(L-11)

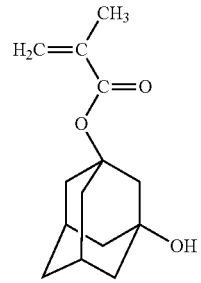

(A2-6)

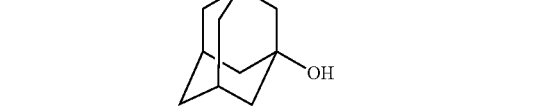

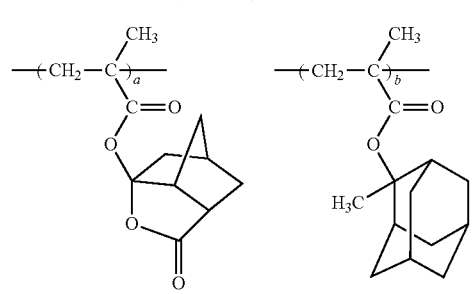

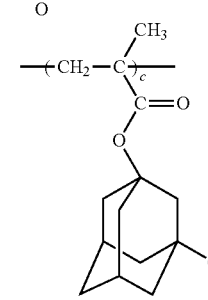

Here, the evaluation of each resist was carried out in the following manner.

Sensitivity:

As shown in FIG. 1, a wafer in which steps of polysilicon 2 having a height of 100 nm and a line width of 90 nm were formed at 180 nm spaces on a silicon substrate 1 was prepared. An exposure dose that forms a line-and-space pattern (1L1S), which has a width ratio 1:1, with a line width of 180 nm (a resist pattern 3 orthogonal to the steps of polysilicon 2 as shown in FIG. 2) in the wafer is defined as the optimum exposure dose, and this optimum exposure dose was assessed as sensitivity.

Figure 2:
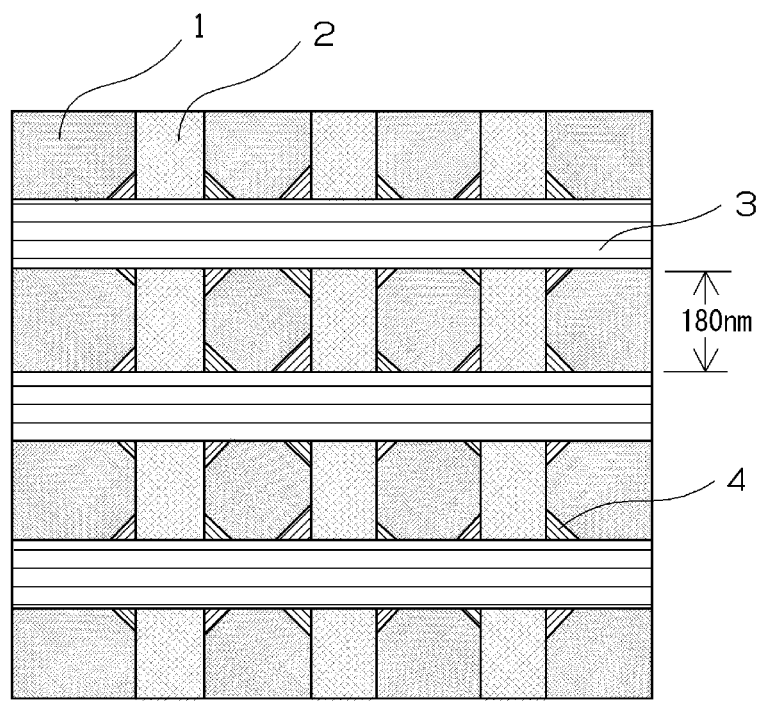
FIG. 2 is a schematic view of the silicon wafer on which a resist pattern is formed.
Figure 3:
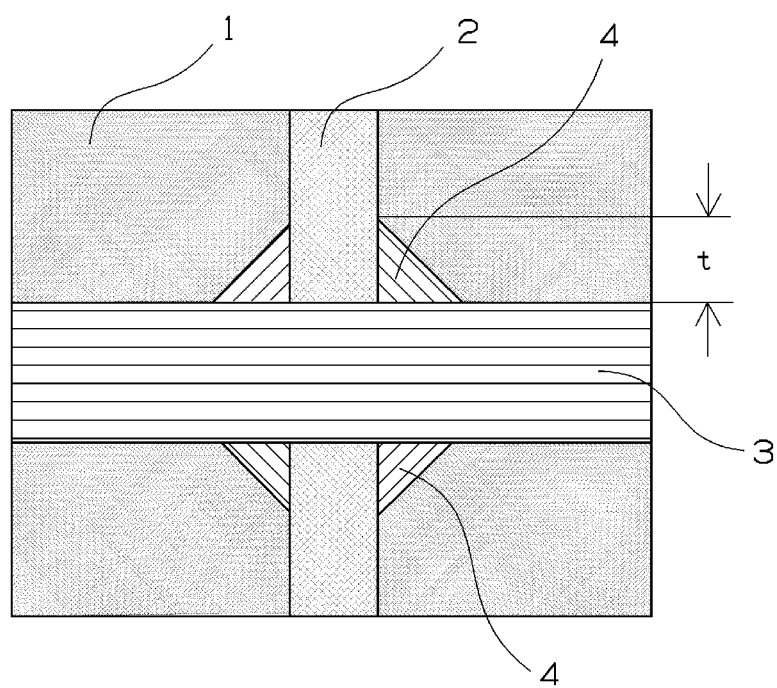
FIG. 3 is an enlarged schematic view of an orthogonal intersection portion of the polysilicon step and the resist pattern.

Scum Margin:

FIG. 3 shows an enlarged view of the resist pattern shown in FIG. 2 in the case where the exposure at the optimum exposure dose was performed. For the scum 4 left in the exposed area around the intersection portion of the resist pattern 3 and the steps 2, the width t between the resist pattern and the edge of the scum was measured. If the width t was no more than 10 nm, it was defined to be "good"; if the width t was more than 10 nm, it was defined to be "bad".

Shape:

The resist pattern was observed with the following CD (Critical Dimension)-scanning electron microscope. In the case where the exposure at the optimum exposure dose was performed, if the white edge (the lack of the edge) of the line pattern of the resist pattern was no more than 5 nm, it was defined to be "good"; if the white edge was more than 5 nm, it was defined to be "bad".

Examples 1 to 13 and Comparative Examples 1 to 3

A homogeneous solution obtained by mixing the components shown in Table 1 (wherein "part" means "part by weight") was filtered by a membrane filter having a pore diameter of 0.2 μm made of Teflon (registered trademark) to prepare a composition solution.

Next, the composition solution was spin-coated onto a silicon wafer, and then PB was performed to it for 90 seconds at 110° C. to obtain a resist film having a thickness of 0.3 μm. After that, the resist film was exposed through a mask pattern with KrF excimer laser (wavelength: 248 nm) using a KrF excimer laser exposure system NSR-S203B (trade name; manufactured by Nikon Corp.), and then PEB was performed to it for 90 seconds at 110° C. Then, the resist film was developed for 60 seconds at 23° C. using a 2.38 weight % tetramethylammonium hydroxide aqueous solution, washed with water for 30 seconds, and dried to form a resist pattern. The resist pattern was observed using CD-scanning electron microscope S-9220 (trade name; manufactured by Hitachi High-Technologies Corporation).

The evaluation results of Examples and Comparative examples are shown in Table 2.

In Table 1, each component other than resin (A) is as follows.

Acid Generator (B)
B-1: N-(trifluoromethanesulfonyloxy)bicyclo[2.2.1]hept-5-en-2,3-dicarboximide
B-2: bis(cyclohexanesulfonyl)diazomethane
B-3: N-(10-camphorsulfonyloxy)succinimide
B-4: 2,4,6-trimethylphenyl diphenyl sulfonium 2,4-difluoro benzenesulfonate
B-5: triphenylsulfonium benzenesulfonate
B-6: triphenylsulfonium nonafluorobutane sulfonate
Acid Diffusion Controller
C-1: 2-phenyl benzimidazole
Solvent
D-1: ethyl lactate
D-2: propylene glycol monomethyl ether acetate
D-3: 3-ethoxy propionic acid ethyl

TABLE 1

| | Resin (part) | Acid generator (part) | Acid diffusion controller (part) | Solvent (part) |
|---|---|---|---|---|
| Example 1 | A1-1 (90) A2-1 (10) | B-1 (10) B-5 (2) | C-1 (0.8) | D-1 (430) D-2 (180) |
| Example 2 | A1-2 (90) A2-1 (10) | B-1 (10) B-5 (2) | C-1 (0.8) | D-1 (430) D-2 (180) |
| Example 3 | A1-3 (90) A2-1 (10) | B-1 (10) B-5 (2) | C-1 (0.8) | D-1 (430) D-2 (180) |
| Example 4 | A1-2 (80) A2-3 (20) | B-1 (10) B-5 (2) | C-1 (0.8) | D-1 (430) D-2 (180) |
| Example 5 | A1-2 (60) A2-4 (40) | B-1 (10) B-5 (2) | C-1 (0.8) | D-1 (430) D-2 (180) |
| Example 6 | A1-1 (90) A2-5 (10) | B-1 (10) B-5 (2) | C-1 (0.8) | D-1 (430) D-2 (180) |
| Example 7 | A1-2 (80) A2-6 (20) | B-1 (10) B-5 (2) | C-1 (0.8) | D-1 (430) D-2 (180) |
| Example 8 | A1-1 (90) A2-1 (10) | B-1 (5) B-3 (5) B-5 (2) | C-1 (0.8) | D-1 (430) D-2 (180) |
| Example 9 | A1-1 (90) A2-1 (10) | B-1 (10) B-6 (2) | C-1 (0.8) | D-1 (430) D-2 (180) |
| Example 10 | A1-1 (90) A2-1 (10) | B-2 (10) B-5 (2) | C-1 (0.8) | D-2 (430) D-3 (180) |
| Example 11 | A1-1 (90) A2-1 (10) | B-1 (10) B-7 (2) | C-1 (0.8) | D-2 (430) D-3 (180) |
| Example 12 | A1-1 (90) A2-1 (10) | B-1 (5) B-4 (5) B-7 (2) | C-1 (0.8) | D-2 (430) D-3 (180) |
| Example 13 | A1-1 (90) A2-2 (10) | B-1 (10) B-5 (2) | C-1 (0.8) | D-1 (430) D-2 (180) |
| Comparative Example 1 | A1-1 (100) | B-1 (10) B-5 (2) | C-1 (0.8) | D-1 (430) D-2 (180) |
| Comparative Example 2 | A1-2 (100) | B-1 (5) B-3 (5) B-5 (2) | C-1 (0.8) | D-1 (430) D-2 (180) |
| Comparative Example 3 | A1-4 (100) | B-1 (10) B-5 (2) | C-1 (0.8) | D-1 (430) D-2 (180) |

TABLE 2

| | Sensitivity [mJ/cm$^2$] | Scum margin | Shape |
|---|---|---|---|
| Example 1 | 32 | good | good |
| Example 2 | 29 | good | good |
| Example 3 | 20 | good | good |
| Example 4 | 31 | good | good |
| Example 5 | 33 | good | good |
| Example 6 | 33 | good | good |
| Example 7 | 32 | good | good |
| Example 8 | 36 | good | good |
| Example 9 | 27 | good | good |
| Example 10 | 31 | good | good |
| Example 11 | 29 | good | good |
| Example 12 | 28 | good | good |
| Example 13 | 27 | good | good |
| Comparative Example 1 | 34 | bad | bad |
| Comparative Example 2 | 38 | bad | bad |
| Comparative Example 3 | 39 | bad | bad |

The radiation-sensitive composition of the embodiment of the present invention is excellent in scum margin and able to realize a resist pattern having a favorable shape. Therefore, it can be preferably used as a material for the lithography with a light source of KrF excimer laser.

Obviously, numerous modifications and variations of the present invention are possible in light of the above teachings. It is therefore to be understood that within the scope of the appended claims, the invention may be practiced otherwise than as specifically described herein.

The invention claimed is:

1. A radiation-sensitive composition comprising:
a polymer composition comprising a first polymer and a second polymer, said first polymer comprising a repeating unit shown by formula (1) and a repeating unit comprising an acid-labile group, said second polymer comprising a repeating unit shown by formula (2) and not comprising a repeating unit shown by the formula (1); and
a radiation-sensitive acid generator,

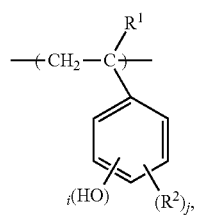
(1)

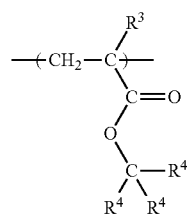
(2)

wherein in the formula (1),
R$^1$ represents a hydrogen atom, a methyl group, or a trifluoromethyl group,
R$^2$ represents a hydrogen atom, a linear or branched alkyl group having 1 to 12 carbon atoms, a linear or branched alkoxyl group having 1 to 12 carbon atoms, or a group shown by formula (1-1), and
i represents an integer from 1 to 3, and j represents an integer from 0 to 3, satisfying i+j≤5;

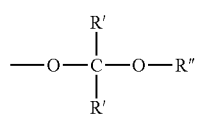
(1-1)

wherein in the formula (1-1),
each R' individually represents a hydrogen atom or a methyl group, and
R" represents a linear or branched alkyl group having 1 to 8 carbon atoms or a cycloalkyl group; and
wherein in the formula (2),
R$^3$ represents a hydrogen atom or a methyl group, and
each R$^4$ individually represents a monovalent alicyclic hydrocarbon group having 4 to 20 carbon atoms, a derivative thereof, or a linear or branched alkyl group having 1 to 4 carbon atoms, or
two of R$^4$s bond to each other to form a divalent alicyclic hydrocarbon group having 4 to 20 carbon atoms or a derivative thereof in combination with the carbon atom to which the two of R$^4$s bond, and one of R$^4$s other than the two of R$^4$s is a linear or branched alkyl group having 1 to 4 carbon atoms, a monovalent alicyclic hydrocarbon group having 4 to 20 carbon atoms, or a derivative thereof,
wherein said second polymer is contained at 1 to 20 weight % for 100 weight % of said polymer composition.

2. The radiation-sensitive composition according to claim 1, wherein said repeating unit comprising an acid-labile group is shown by formula (6) or formula (7),

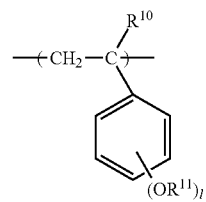
(6)

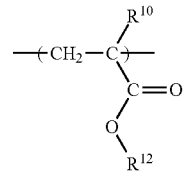
(7)

wherein in the formulas (6) and (7),
R$^{10}$ represents a hydrogen atom or a methyl group;
wherein in the formula (6),
R$^{11}$ represents a monovalent acid-labile group, and
l is an integer from 1 to 3; and
wherein in the formula (7),
R$^{12}$ represents a monovalent acid-labile group.

3. The radiation-sensitive composition according to claim 1, wherein said second polymer comprises a repeating unit shown by formula (3-1), a repeating unit shown by formula (3-2), a repeating unit shown by formula (3-3), or a combination thereof,

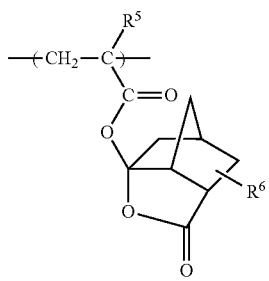
(3-1)

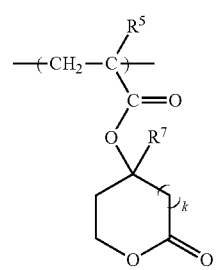
(3-2)

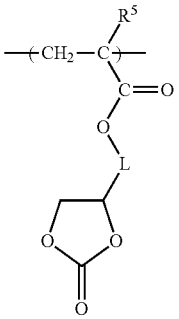
(3-3)

wherein in the formulas (3-1) to (3-3),
  $R^5$ represents a hydrogen atom or a methyl group;
wherein in the formula (3-1),
  $R^6$ represents a hydrogen atom, a linear or branched alkyl group having 1 to 4 carbon atoms, a linear or branched alkoxyl group having 1 to 4 carbon atoms, or a linear or branched fluoroalkyl group having 1 to 4 carbon atoms;
wherein in the formula (3-2),
  $R^7$ represents a hydrogen atom or a linear or branched alkyl group having 1 to 4 carbon atoms, and
  k represents an integer from 0 to 3; and
wherein in the formula (3-3),
  L represents a single bond or an alkylene group having 1 to 3 carbon atoms.

4. The radiation-sensitive composition according to claim 1, wherein said second polymer further comprises a repeating unit shown by formula (4),

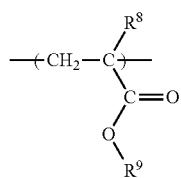
(4)

wherein in the formula (4),
  $R^8$ represents a hydrogen atom or a methyl group, and
  $R^9$ represents a polycyclic alicyclic hydrocarbon group having 7 to 20 carbon atoms.

5. The radiation-sensitive composition according to claim 1, wherein said radiation-sensitive acid generator comprises a non-ionic radiation-sensitive acid generator.

6. The radiation-sensitive composition according to claim 5, wherein said non-ionic radiation-sensitive acid generator is a sulfonyloxyimide compound.

7. The radiation-sensitive composition according to claim 5, wherein said non-ionic radiation-sensitive acid generator is a sulfonyldiazomethane compound.

8. The radiation-sensitive composition according to claim 5, wherein said radiation-sensitive acid generator further comprises an onium salt compound that generates a benzenesulfonic acid that is substituted with a fluorine atom or unsubstituted.

9. The radiation-sensitive composition according to claim 3, wherein said second polymer further comprises a repeating unit shown by formula (4),

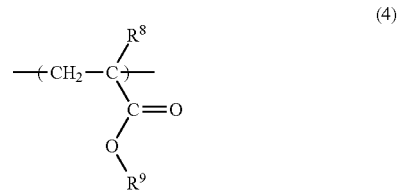
(4)

wherein in the formula (4),
  $R^8$ represents a hydrogen atom or a methyl group, and
  $R^9$ represents a polycyclic alicyclic hydrocarbon group having 7 to 20 carbon atoms.

10. The radiation-sensitive composition according to claim 6, wherein said radiation-sensitive acid generator further comprises an onium salt compound that generates a benzenesulfonic acid that is substituted with a fluorine atom or unsubstituted.

11. The radiation-sensitive composition according to claim 7, wherein said radiation-sensitive acid generator further comprises an onium salt compound that generates a benzenesulfonic acid that is substituted with a fluorine atom or unsubstituted.

* * * * *